(12) United States Patent
Chindamo et al.

(10) Patent No.: US 7,254,760 B2
(45) Date of Patent: Aug. 7, 2007

(54) METHODS AND APPARATUS FOR PROVIDING SCAN PATTERNS TO AN ELECTRONIC DEVICE

(75) Inventors: Domenico Chindamo, Rome (IT); Ariadne Salagianis, Bethlehem, PA (US)

(73) Assignee: Verigy (Singapore) PTE. Ltd., Singapore (SG)

( * ) Notice: Subject to any disclaimer, the term of this patent is extended or adjusted under 35 U.S.C. 154(b) by 359 days.

(21) Appl. No.: 10/959,856

(22) Filed: Oct. 5, 2004

(65) Prior Publication Data

US 2006/0075316 A1    Apr. 6, 2006

(51) Int. Cl.
G01R 31/28 (2006.01)
G06F 11/00 (2006.01)

(52) U.S. Cl. ............... 714/726; 714/733; 714/732; 714/30

(58) Field of Classification Search ........... 714/726, 714/733, 732, 30
See application file for complete search history.

(56) References Cited

U.S. PATENT DOCUMENTS

| | | | | |
|---|---|---|---|---|
| 5,790,562 | A * | 8/1998 | Murray et al. | 714/732 |
| 6,393,594 | B1 * | 5/2002 | Anderson et al. | 714/738 |
| 6,424,926 | B1 * | 7/2002 | Mak | 702/117 |
| 6,591,211 | B1 * | 7/2003 | Schnarch | 702/108 |
| 2003/0005389 | A1 | 1/2003 | Ernst et al. | |
| 2004/0230870 | A1 * | 11/2004 | Wang et al. | 714/30 |
| 2006/0075317 | A1 * | 4/2006 | Chindamo et al. | 714/726 |

FOREIGN PATENT DOCUMENTS

WO    WO 01/38889 A1    5/2001

OTHER PUBLICATIONS

M. Nourani, et al., "Testing High-Speed SoCs Uisng Low-Speed ATEs", May 2, 2002, 6 pages.
Synopsys, Inc., "Physical Scan Synthesis—1-Pass Physical Scan Ordering Technology Backgrounder", Oct. 2001, 7 pages.
Synopsys, Inc., "Hierarchical Scan Synthesis Methodology Using Test Models—High-Capacity/Performance Scan Synthesis Technology Backgrounder", Oct. 2001, 7 pages.
Davide Appello, et al., "Leveraging P1450.6 for faster production test development—Core Test Language (CTL) dramatically improves manufacturing test", 2003, 7 pages.
Synopsys, Inc., "DFT Compiler SoCBIST Deterministic Logic BIST—Technology Backgrounder", Sep. 2002, 7 pages.
Synopsys, Inc., "DFT Compiler SoCBIST Deterministic Logic BIST", Sep. 2002, 2 pages.
Agilent Technologies, Inc."Reducing Cost of Test Through DFT", 2003, 2 pages.
Hellebrand, et al.; "Pattern Generation for a Deterministic BIST Scheme"; IEEE; 1995; pp. 88-94.

* cited by examiner

*Primary Examiner*—Phung My Chung

(57) ABSTRACT

In one embodiment, a method provides scan patterns to an electronic device having BIST hardware. The BIST hardware has production and diagnostic test modes, and the device outputs one or more response signatures in the production test mode and outputs raw response data in the diagnostic test mode. In production test mode, the method uses ATE to 1) provide a first series of scan test patterns to the BIST hardware, and 2) capture and compare response signatures to expected response signatures, to identify a number of failing scan test patterns. The method then uses the ATE to identify a number of unique labels associated with the failing patterns. In diagnostic test mode, the method uses the ATE to 1) provide a second series of scan test patterns to the BIST hardware, and 2) capture raw response data. The scan test patterns in the second series correspond to the identified labels.

19 Claims, 3 Drawing Sheets

PROGRAM CODE TO CAUSE ATE TO:

PLACE BIST HARDWARE OF AN ELECTRONIC DEVICE ~402
IN A PRODUCTION TEST MODE

PROVIDE A FIRST SERIES OF SCAN TEST PATTERNS TO ~404
   THE BIST HARDWARE

CAPTURE RESPONSE SIGNATURES CORRESPONDING TO ~406
   THE SCAN TEST PATTERNS

COMPARE THE CAPTURED RESPONSE SIGNATURES TO ~408
   EXPECTED RESPONSE SIGNATURES, TO IDENTIFY
   A NUMBER OF FAILING SCAN TEST PATTERNS

IDENTIFY A NUMBER OF UNIQUE LABELS ASSOCIATED ~410
WITH THE FAILING SCAN TEST PATTERNS

PLACE THE BIST HARDWARE IN A DIAGNOSTIC TEST MODE ~412

PROVIDE A SECOND SERIES OF SCAN TEST PATTERNS TO ~414
   THE BIST HARDWARE, THE SCAN TEST PATTERNS IN THE
   SECOND SERIES CORRESPONDING TO THE IDENTIFIED LABELS

CAPTURE RAW RESPONSE DATA CORRESPONDING ~416
   TO THE SCAN TEST PATTERNS

METHODS AND APPARATUS FOR PROVIDING SCAN PATTERNS TO AN ELECTRONIC DEVICE

BACKGROUND

Circuit test can generally be divided into two classes: functional and structural. With functional test, a test engineer and/or software 1) emulates the stimuli and responses that a circuit might receive/generate at its inputs and outputs during normal use, 2) applies the stimuli to the circuit's inputs, 3) captures responses to the stimuli at the circuit's outputs, and 4) compares the captured responses to the expected responses. With structural test, a circuit's intended function has little or no bearing on the generation of circuit tests. Rather, a circuit is provided with a plurality of storage elements that are linked to form a scan chain about a combinational logic "core". A circuit test pattern is then shifted into the storage elements; the pattern is launched into the logic core; and a response to the test pattern is then captured via the elements of the scan chain. The captured response is then shifted out of the storage elements and compared to an expected response. By exercising the logic core using a variety of test patterns, one can infer that the structure of the logic core is present and appropriately connected. If the structure of the logic core is present and appropriately connected, one can then infer that it should function as designed. Structural test is therefore advantageous in that one need not emulate nor understand a circuit's function, but need only exercise its logic.

A circuit that is designed for structural test will typically comprise "design-for-test" (DFT) structures. In a simple case, DFT structures may only comprise a plurality of storage elements that are linked to form a scan chain. In more complex cases, DFT structures may comprise storage elements that are linked in multiple scan chains; or DFT structures may comprise built-in self-test (BIST) hardware that 1) generates scan patterns internally to a device under test, and 2) optionally collects responses to scan patterns and compresses them into one or more output signatures.

SUMMARY OF THE INVENTION

In one embodiment, a method provides scan patterns to an electronic device having built-in self-test (BIST) hardware. The BIST hardware has a production test mode and a diagnostic test mode, and the electronic device outputs one or more response signatures in the production test mode and outputs raw response data in the diagnostic test mode. In production test mode, the method uses automated test equipment (ATE) to 1) provide a first series of scan test patterns to the BIST hardware, and 2) capture and compare response signatures to expected response signatures, to identify a number of failing scan test patterns. The method then uses the ATE to identify a number of unique labels associated with the failing scan test patterns. In diagnostic test mode, the method uses the ATE to 1) provide a second series of scan test patterns to the BIST hardware, and 2) capture raw response data. The scan test patterns in the second series of scan test patterns correspond to the identified labels.

In another embodiment, a method provides scan patterns to input pins of an electronic device. Each input pin is associated with built-in self-test (BIST) hardware having a production test mode and a diagnostic test mode. In the production mode, the electronic device outputs one or more response signatures at output pins of the device, and in the diagnostic test mode, the device outputs raw response data at the output pins. In production test mode, the method uses ATE to 1) provide a series of scan test patterns to the input pins of the device, and 2) capture response signatures at the output pins of the device. The captured response signatures are then compared to expected response signatures to identify a number of failing scan test patterns corresponding to each input pin. The method then uses the ATE to identify a number of unique labels associated with the failing scan test patterns. In diagnostic test mode, and for each input pin, the method uses the ATE to 1) provide a second series of scan test patterns to the input pin, and 2) capture raw response data. The scan test patterns in the second series of scan test patterns correspond to the identified labels for the input pin.

Other embodiments are also disclosed.

BRIEF DESCRIPTION OF THE DRAWINGS

Illustrative and presently preferred embodiments of the invention are illustrated in the drawings, in which:

FIG. 4 illustrates exemplary program code that may be stored on computer-readable media to cause execution of a method such as that which is illustrated in FIG. 2.

DETAILED DESCRIPTION OF AN EMBODIMENT

One DFT structure that may be incorporated into a circuit, and in particular, a system-on-a-chip (SOC), is a deterministic BIST structure, such as the DBIST structure offered by Synopsis, Inc. (of Mountain View, Calif., USA).

Figure 1:
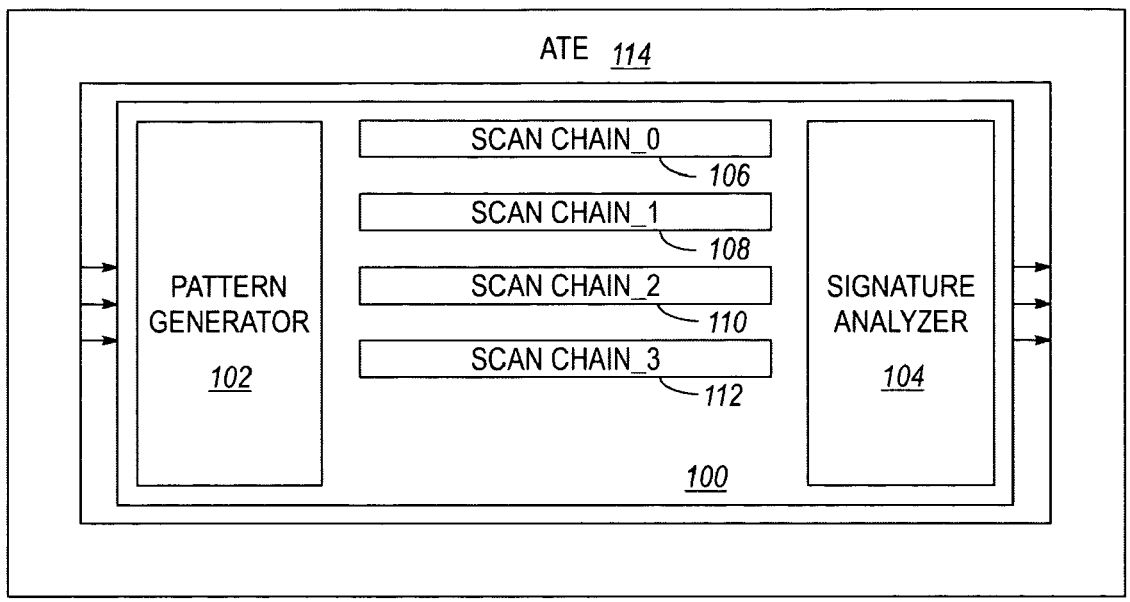
FIG. 1 illustrates an exemplary system-on-a-chip (SOC) incorporating BIST hardware, as well as automated test equipment for testing the SOC.

An SOC 100 incorporating a deterministic BIST structure is shown in FIG. 1. By way of example, the deterministic BIST structure comprises a pattern generator 102 and a signature analyzer 104. Coupled between the pattern generator 102 and signature analyzer 104 are a plurality of scan chains 106, 108, 110, 112. In use, an externally generated scan "seed" (i.e., a seed provided by ATE 114) is provided to the pattern generator 102. The pattern generator 102 then uses the seed as a basis for generating a plurality of scan patterns, which are then shifted into the various scan chains 106–112. After launching the patterns from the scan chains 106–112, responses to the patterns are captured via the scan chains 106–112 and shifted to the signature analyzer 104. With deterministic BIST, the signature analyzer 104 may comprise a multiple-input shift register (MISR) that is capable of converting hundreds of thousands of shifted bits into a 128-bit signature.

A deterministic BIST structure may be capable of operating in several modes, including a production test mode and a diagnostic test mode. In the production test mode, an SOC's scan chains 106–112 are coupled between the deterministic BIST pattern generator 102 and signature analyzer 104, as shown in FIG. 1. In the diagnostic test mode, the SOC's scan chains 106–112 are coupled to the pattern generator 102, but decoupled from the signature analyzer 104 (i.e., their outputs bypass the signature analyzer 104). Thus, in diagnostic test mode, raw response data can be acquired from the scan chains 106–112. This raw response data can then be analyzed in greater detail external to the SOC 100.

Typically, deterministic BIST hardware 102, 104 will be placed in the production test mode during a "first pass" of scan testing. During this first pass, failing scan intervals (i.e., groups of scan patterns) are identified. During a second pass, the deterministic BIST hardware 102, 104 may be placed in the diagnostic test mode, and the scan patterns of the failing intervals may be re-run.

Figure 2:
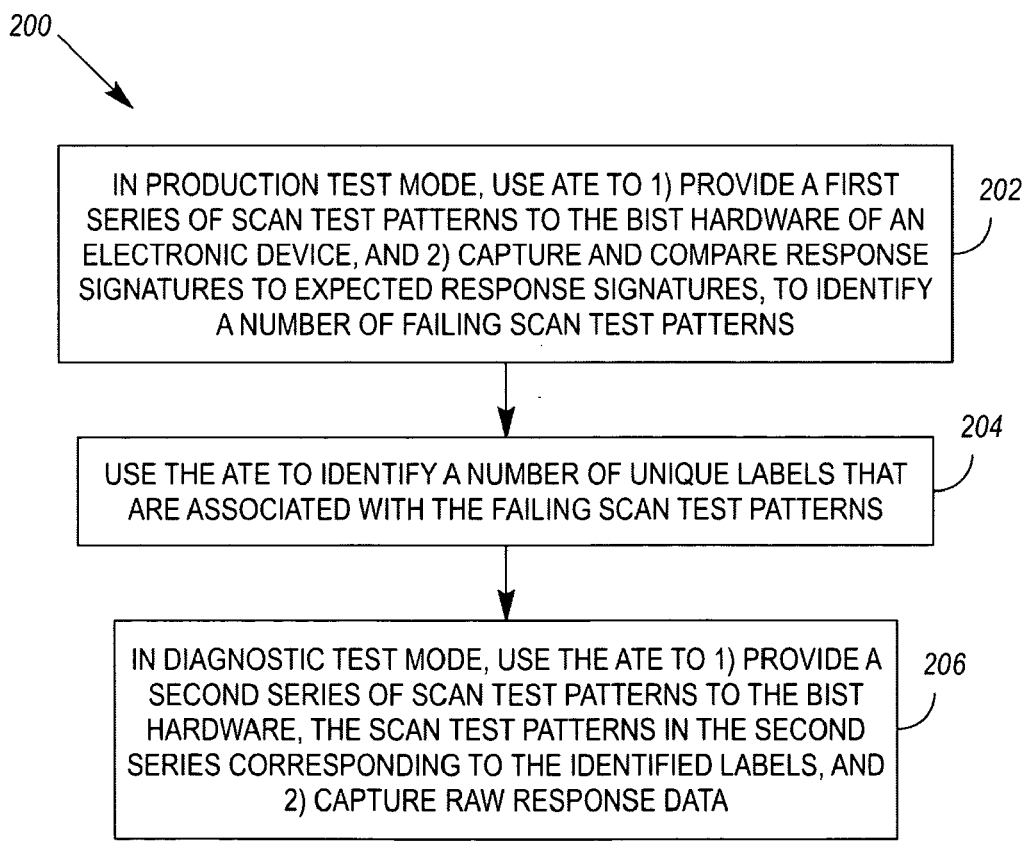
FIG. 2 illustrates an exemplary method for providing scan patterns to an electronic device having BIST hardware such as that which is shown in FIG. 1.
Figure 3:
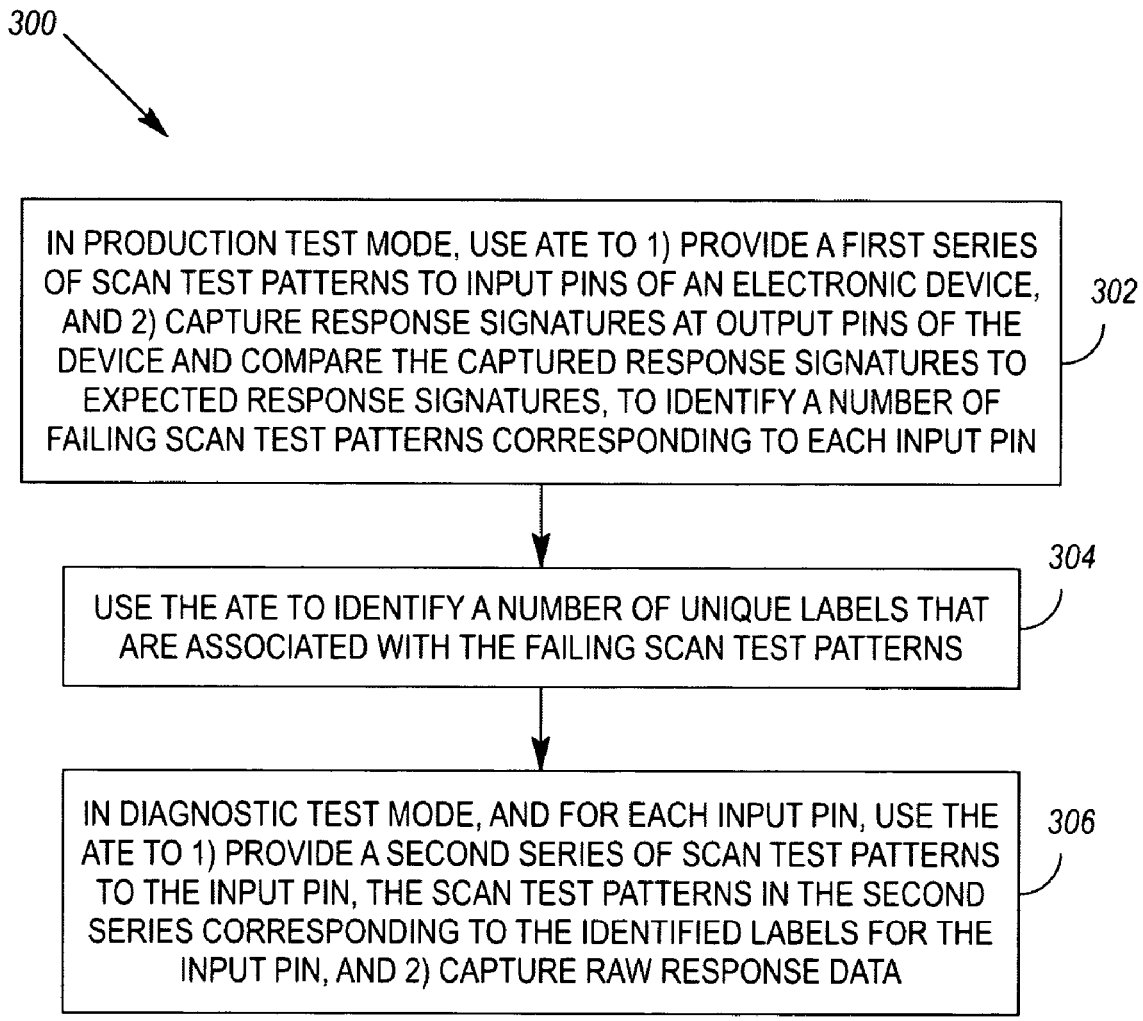
FIG. 3 illustrates an exemplary method for providing scan patterns to an electronic device having BIST hardware (such as that which is shown in FIG. 1) associated with each of a number of its input and output pins.

To re-run the scan patterns of the failing intervals, a test engineer has typically had to manually identify the memory locations of the failing intervals using information provided by a design engineer. The test engineer has then had to manipulate vector data to re-run the failing intervals, and has had to make sure that tester memory limitations are not exceeded (i.e., since large volumes of raw response data can sometimes exceed tester memory limitations). These largely manual steps are time consuming and error prone, and they can cause significant delay and disruption during production testing. FIG. 2 therefore illustrates a new method for providing scan patterns to an electronic device having BIST hardware such as that which is shown in FIG. 1.

The method 200 proceeds as follows. In production test mode, automated test equipment (ATE) is used 202 to 1) provide a first series of scan test patterns to the BIST hardware of an electronic device, and 2) capture and compare response signatures to expected response signatures. The results of the comparisons may then be used to identify a number of failing scan test patterns. The ATE is then used 204 to identify a number of unique labels that are associated with the failing scan test patterns. In diagnostic test mode, the ATE is used 206 to 1) provide a second series of scan test patterns to the BIST hardware, and 2) capture raw response data. The scan test patterns in the second series correspond to the identified labels.

In one embodiment of the method 200, each series of scan test patterns may comprise multiple intervals of scan test patterns (e.g., as is the case with Synopsis' DBIST). The number of failing scan test patterns may then be identified by identifying labels corresponding to a number of failing intervals of scan test patterns.

Unique labels may be associated with different scan patterns, or different intervals of scan patterns, by, for example, separately storing each of the different scan patterns (or intervals of scan patterns). In this manner, different vectors of scan patterns may be compiled from the same test patterns, regardless of whether BIST hardware is placed in production test mode or diagnostic test mode. Although labels need only be provided for each interval, finer granularity of labels (i.e. labels for each scan pattern) can sometimes provide more efficient use of production test time and memory.

In some cases, the series of scan test patterns that are provided to an electronic device during production test mode may be executed within a single production test vector (e.g., in a "burst" mode). Then, during diagnostic test mode, ATE may dynamically generate and execute a plurality of diagnostic test vectors (e.g., a vector for each identified label, in an "unburst" mode, or vectors for groups of labels that will result in the production of raw response data that will fit within the ATE's memory limitations); or, the ATE may dynamically compile the identified labels into a single diagnostic test vector (e.g., in a "burst" mode).

By way of example, the ATE used by the method 200 may be a system-on-a-chip (SOC) tester, such as the 93000 SOC Tester offered by Agilent Technologies, Inc. (of Palo Alto, Calif.). However, given that the 93000 SOC tester is capable of providing data to, and collecting data from, a plurality of device pins in parallel, the method 300 may be better suited to take advantage of the 93000 SOC tester's capabilities.

The method 300 operates as follows. In production test mode, ATE is used 302 to 1) provide a series of scan test patterns to a plurality of input pins of an electronic device, and 2) capture response signatures at output pins of the electronic device. The captured response signatures are then compared to expected response signatures to identify a number of failing scan test patterns corresponding to each input pin. The ATE is then used 304 to identify a number of unique labels that are associated with the failing scan test patterns. In diagnostic test mode, and for each input pin, the ATE is used 306 to 1) provide a second series of scan test patterns to the input pin, and 2) capture raw response data. The scan test patterns in the second series of test patterns correspond to the identified labels for the input pin.

In one embodiment of the method 300, each series of scan test patterns may comprise multiple intervals of scan test patterns (e.g., as is the case with Synopsis' DBIST). The number of failing scan test patterns may then be identified by identifying a number of labels corresponding to failing intervals of scan test patterns.

In some cases, the series of scan test patterns that are provided to an input pin during production test mode may be executed within a single production test vector. In other cases, all of the series of scan test patterns that are provided to input pins of an electronic device may be executed within a single production test vector.

During the diagnostic test mode, ATE may dynamically generate and execute a plurality of diagnostic test vectors for each input pin of a device. For example, the ATE may execute a vector for each identified label, or may execute vectors for groups of labels that will result in the production of raw response data that will fit within the ATE's memory limitations. Alternatively, the ATE may dynamically compile the identified labels into a single diagnostic test vector for each pin, or a single diagnostic test vector for the device.

Either of the methods 200, 300, including variants thereof, may be embodied in program code 402–414 stored on computer-readable media 400 such as a memory or disk (whether fixed or removable). Note that "memory" is herein construed to cover both a unified memory structure, or a distributed or function-specific memory structure. For example, the 93000 SOC Tester comprises a memory structure that is divided into per-pin vector and sequencer memories for respectively storing vector and sequencer (i.e., program instructions) for each pin of the 93000 SOC Tester.

In the case of the method 200, the program code may comprise program code to cause ATE to place 402 BIST hardware of an electronic device in a production test mode. While the BIST hardware is in production test mode, the program code may then cause the ATE to 1) provide 404 a first series of scan test patterns to said BIST hardware, 2) capture 406 response signatures corresponding to the scan test patterns, and 3) compare 408 the captured response signatures to expected response signatures to identify a number of failing scan test patterns. The program code may then identify 410 a number of unique labels that are associated with the failing scan test patterns. Thereafter, the program code may cause the ATE to place 412 the BIST hardware of the device in a diagnostic test mode. While the BIST hardware is in diagnostic test mode, the program code may cause the ATE to 1) provide 414 a second series of scan test patterns to the BIST hardware, and 2) capture 416 raw response data corresponding to the scan test patterns. As previously noted, the scan test patterns in the second series may correspond to those identified by labels associated with failing scan test patterns.

Other features and variations of the method 200, as well as features and variations of the method 300, may be embodied in program code in a similar fashion.

What is claimed is:

1. A method for providing scan patterns to an electronic device having built-in self-test (BIST) hardware, the BIST hardware having a production test mode and a diagnostic test mode, and the electronic device outputting one or more response signatures in the production test mode and outputting raw response data in the diagnostic test mode, the method comprising:

in production test mode, using automated test equipment (ATE) to i) provide a first series of scan test patterns to said BIST hardware, and ii) capture and compare response signatures to expected response signatures, to identify a number of failing scan test patterns;

using the ATE to identify a number of unique labels associated with said failing scan test patterns; and in diagnostic test mode, using the ATE to i) provide a second series of scan test patterns to said BIST hardware, the scan test patterns in said second series corresponding to said identified labels, and ii) capture raw response data.

2. The method of claim 1, wherein each series of scan test patterns comprises multiple intervals of scan test patterns; and wherein the number of failing scan test patterns are identified by identifying labels corresponding to a number of failing intervals of scan test patterns.

3. The method of claim 1, wherein said first series of scan test patterns is executed within a single production test vector.

4. The method of claim 1, wherein the ATE dynamically compiles said identified labels into a single diagnostic test vector.

5. The method of claim 1, wherein the ATE dynamically generates and executes a plurality of diagnostic test vectors when providing the scan test patterns in the second series to said BIST hardware.

6. The method of claim 1, wherein the ATE is a system-on-a-chip (SOC) tester.

7. A method for providing scan patterns to input pins of an electronic device, each input pin being associated with built-in self-test (BIST) hardware, the BIST hardware having a production test mode and a diagnostic test mode, and the electronic device outputting one or more response signatures at output pins of the electronic device in the production test mode and outputting raw response data at said output pins in the diagnostic test mode, the method comprising:

in production test mode, using automated test equipment (ATE) to i) provide a series of scan test patterns to said input pins, and ii) capture response signatures at said output pins and compare captured response signatures to expected response signatures, to identify a number of failing scan test patterns corresponding to each input pin;

using the ATE to identify a number of unique labels associated with said failing scan test patterns; and in diagnostic test mode, and for each input pin, using the ATE to i) provide a second series of scan test patterns to the input pin, the scan test patterns in said second series corresponding to said identified labels for the input pin, and ii) capture raw response data.

8. The method of claim 7, wherein each series of scan test patterns comprises multiple intervals of scan test patterns; and wherein the number of failing scan test patterns are identified by identifying labels corresponding to a number of failing intervals of scan test patterns.

9. The method of claim 7, wherein each series of scan test patterns provided to an input pin during production test mode is executed within a single production test vector.

10. The method of claim 7, wherein all of the series of scan test patterns provided to the input pins during production test mode are executed within a single production test vector.

11. The method of claim 7, wherein, for each input pin, the ATE dynamically compiles said labels identified for the input pin into a single diagnostic test vector.

12. The method of claim 7, wherein the ATE dynamically generates and executes a plurality of diagnostic test vectors when providing the scan test patterns in the second series to said input pins.

13. The method of claim 7, wherein the ATE is a system-on-a-chip (SOC) tester.

14. Apparatus, comprising:

computer-readable media; and program code, stored on the computer-readable media, to cause automated test equipment (ATE) to perform the actions of:

placing built-in self-test (BIST) hardware of an electronic device in a production test mode, and:

providing a first series of scan test patterns to said BIST hardware;

capturing response signatures corresponding to said scan test patterns; and comparing said captured response signatures to expected response signatures, to identify a number of failing scan test patterns;

identifying a number of unique labels associated with said failing scan test patterns; and placing the BIST hardware in a diagnostic test mode, and:

providing a second series of scan test patterns to the BIST hardware, the scan test patterns in said second series corresponding to said identified labels; and capturing raw response data corresponding to said scan test patterns.

15. The apparatus of claim 14, wherein each series of scan test patterns comprises multiple intervals of scan test patterns; and wherein the program code identifies the number of failing scan test patterns by identifying a number of failing intervals of scan test patterns.

16. The apparatus of claim 14, wherein the program code causes the first series of scan test patterns to be executed within a single production test vector.

17. The apparatus of claim 14, wherein the program code causes the ATE to dynamically compile said identified labels into a single diagnostic test vector.

18. The apparatus of claim 14, wherein the program code causes the ATE to dynamically generate and execute a plurality of diagnostic test vectors when providing the scan test patterns in the second series to said BIST hardware.

19. The apparatus of claim 14, wherein the ATE is a system-on-a-chip (SOC) tester.

* * * * *